United States Patent
Ono

(10) Patent No.: US 8,247,898 B2
(45) Date of Patent: Aug. 21, 2012

(54) SEMICONDUCTOR DEVICE AND SEMICONDUCTOR DEVICE MOUNTED STRUCTURE

(75) Inventor: Masahiro Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 230 days.

(21) Appl. No.: 12/702,804

(22) Filed: Feb. 9, 2010

(65) Prior Publication Data
US 2010/0207264 A1    Aug. 19, 2010

(30) Foreign Application Priority Data
Feb. 18, 2009 (JP) .................... 2009-035114

(51) Int. Cl.
*H01L 23/48* (2006.01)

(52) U.S. Cl. ........ 257/690; 257/680; 257/686; 257/692; 257/697; 257/700

(58) Field of Classification Search .................. 257/659, 257/660, 734
See application file for complete search history.

(56) References Cited

U.S. PATENT DOCUMENTS

| | | | |
|---|---|---|---|
| 2004/0238934 A1* | 12/2004 | Warner et al. ................. | 257/686 |
| 2007/0178729 A1 | 8/2007 | Ohtsuki | |
| 2008/0237589 A1* | 10/2008 | Negishi ......................... | 257/48 |
| 2009/0002967 A1 | 1/2009 | Asami | |
| 2009/0315156 A1* | 12/2009 | Harper .......................... | 257/660 |
| 2010/0103634 A1* | 4/2010 | Funaya et al. ................ | 361/761 |
| 2011/0248389 A1* | 10/2011 | Yorita et al. .................. | 257/659 |

FOREIGN PATENT DOCUMENTS

| JP | 2000-151083 | 5/2000 |
|---|---|---|
| JP | 2002-314027 | 10/2002 |
| JP | 2004-193187 | 7/2004 |
| JP | 2005-183430 | 7/2005 |
| JP | 2006-196857 | 7/2006 |
| JP | 2006-351952 | 12/2006 |
| JP | 2007-207802 | 8/2007 |
| JP | 2009-033114 | 2/2009 |

* cited by examiner

*Primary Examiner* — Kyoung Lee
(74) *Attorney, Agent, or Firm* — McDermott Will & Emery LLP

(57) ABSTRACT

A module substrate has an interconnection electrode that is exposed at a side end face thereof. A semiconductor component including an IC chip is mounted on the module substrate. A molded part comprising a resin is formed so as to cover at least a part of the semiconductor component. A coating with higher heat conductivity than the molded part is formed on the surface of the molded part by applying a paste made of material with higher heat conductivity than the molded part. This improves heat dissipation. The coating can be formed such that it extends to the surface of the main substrate on which the module substrate with the semiconductor component is mounted and comes into contact with the interconnection electrode on the surface of the main substrate. This further improves heat dissipation.

9 Claims, 7 Drawing Sheets

SEMICONDUCTOR DEVICE AND SEMICONDUCTOR DEVICE MOUNTED STRUCTURE

FIELD OF THE INVENTION

The invention relates to a modular semiconductor device including an IC package, and a mounted structure in which the semiconductor device is mounted on a main substrate.

BACKGROUND OF THE INVENTION

Conventionally, semiconductor components are often used as IC packages in which a semiconductor chip (bare chip) mounted on a substrate (package substrate) is encapsulated with a resin. Also, it is common to mount an IC package on another substrate (module substrate or main substrate) and encapsulate them including the connection part between the IC package and the substrate with a resin.

Japanese Laid-Open Patent Publication No. 2000-151083 discloses a mounted structure fabricated by mounting an IC package on a mother board (main substrate) and encapsulating the IC package to reinforce the connection part between the IC package and the mother board. In this mounted structure, a reinforcing frame (cover) is placed over the mother board so as to cover the IC package, and a resin is injected into the frame to encapsulate the IC package.

BRIEF SUMMARY OF THE INVENTION

With the recent increase in processing capability, semiconductor components produce large amounts of heat. Thus, structures in which semiconductor components are mounted are required to provide good heat dissipation.

The heat produced by a semiconductor device composed of semiconductor component(s) such as an IC package mounted on a substrate is currently dissipated via a path from the wiring connecting to the semiconductor component through the substrate. In conventional mounted structures as described in Japanese Laid-Open Patent Publication No. 2000-151083, the heat dissipation path from the sealing resin covering the semiconductor component and the reinforcing frame by heat radiation is also important.

However, as illustrated in FIG. 1(d) of the above-mentioned Japanese Publication, in conventional mounted structures, gaps are often formed between the resin (50) covering the IC package and the frame (10). Hence, the heat transfer path through which the heat of the semiconductor component is transmitted to the frame is divided by the air. As a result, it is often difficult to obtain good heat dissipation.

The invention is achieved in view of the problem as described above and intends to provide a semiconductor device with good heat dissipation and a mounted structure in which the semiconductor device is mounted.

The invention is directed to a semiconductor device including: a first circuit board with a first interconnection electrode that is exposed at a side end face of the first circuit board; a semiconductor component including an IC chip and being mounted on the first circuit board; a molded part comprising a resin and covering at least a part of the semiconductor component; and a coating covering a surface of the molded part. The coating includes a composite of conductive particles and a resin and is in contact with the first interconnection electrode exposed at the side end face of the first circuit board.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Embodiments of the invention are hereinafter described with reference to drawings.

Embodiment 1

Figure 1:
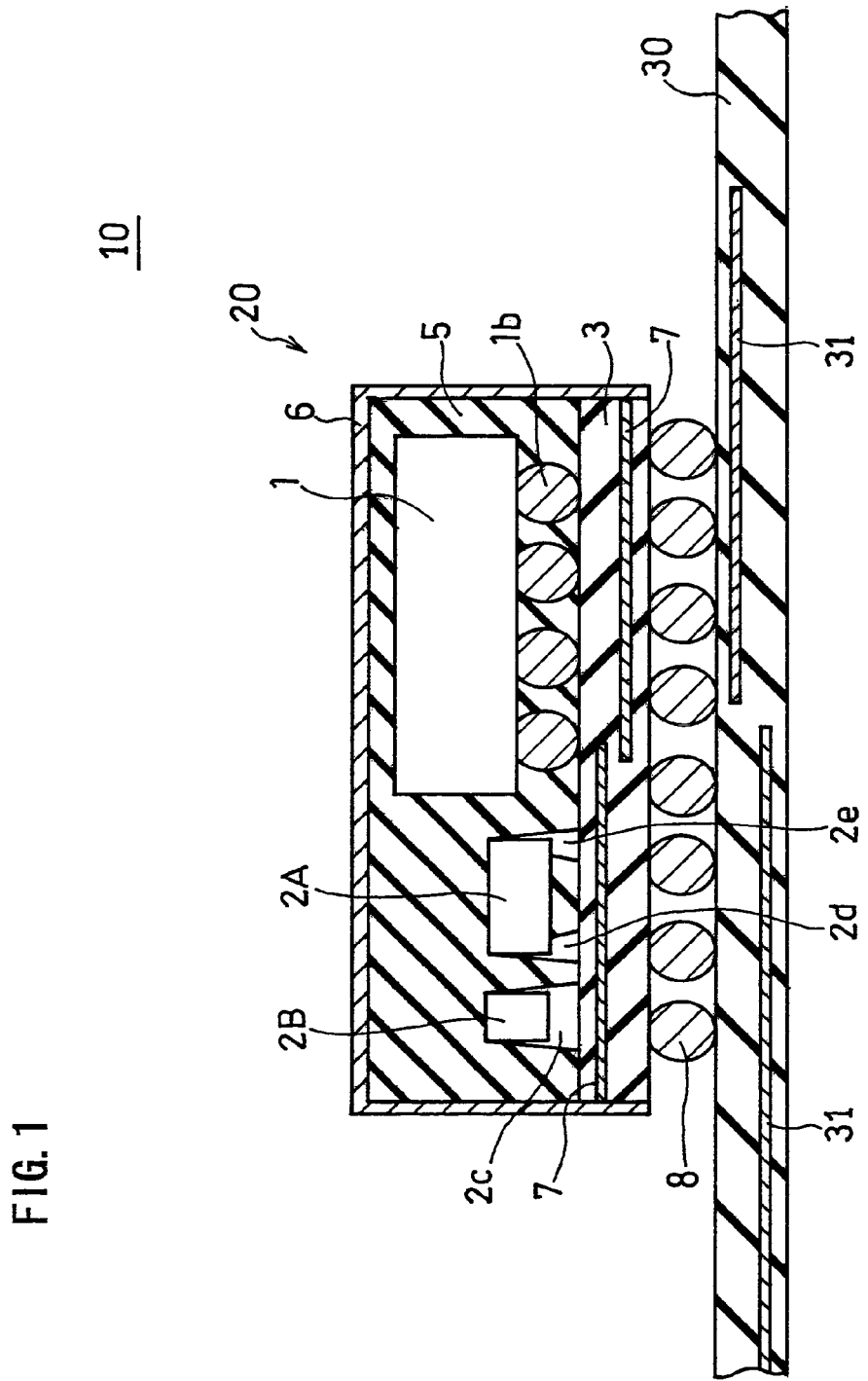
FIG. 1 is a partially cross-sectional view schematically showing the structure of a semiconductor device according to Embodiment 1 of the invention.

FIG. 1 is a partially cross-sectional view of a semiconductor device mounted structure according to Embodiment 1 of the invention.

A mounted structure 10 illustrated in the figure is composed of a semiconductor device 20 mounted on a main substrate (second circuit board) 30. Disposed on the lower face of the semiconductor device 20 are solder balls 8 of a predetermined arrangement, serving as connecting means and electrodes. The solder balls 8 are connected to electrodes (not shown) on the upper face of the main substrate 30. Inside the main substrate 30 are interconnection electrodes 31.

The semiconductor device 20 is fabricated by mounting an IC package 1 and passive components 2A and 2B on a module substrate (first circuit board) 3 and encapsulating the IC package 1 and the passive components 2A and 2B in a resin molded part 5.

The IC package 1 is fabricated by mounting an IC chip on a package substrate (not shown) and encapsulating the IC chip and the connection part between the IC chip and the substrate such as bonding wires with a resin. The IC package 1 illustrated in the figure is a so-called BGA (Ball Grid Array) package. Disposed on the lower face of the package substrate are solder balls 1b of a predetermined arrangement, which connect the IC package 1 with the module substrate 3. Also, the passive component 2A is fixed to the module substrate 3 by fixing members 2d and 2e, and the passive component 2B is fixed to the module substrate 3 by a fixing member 2c.

The surface of the molded part 5 is covered with a coating 6 having a higher heat conductivity than the molded part 5. The coating 6 can be made of, for example, a conductive material. In FIG. 1, the IC package 1, the passive components 2A and 2B, and the fixing members 2c, 2d, and 2e are not shown in section, and only their simplified contours are shown.

The resin constituting the molded part 5 may be a thermosetting resin or a thermoplastic resin. Specifically, usable examples include silicone resin, acrylic resin, ABS resin, polypropylene, polyethylene, polystyrene, polyamide, polycarbonate, polyphthalamide, liquid crystal polymer, fluorocarbon resin, urethane resin, melamine resin, phenolic resin, and epoxy resin. It is also possible to use synthetic rubber and thermoplastic elastomers.

Also, the molded part 5 can be formed by filling a resin into the gaps between the module substrate 3 and the IC package 1 etc. with a dispenser, and applying the resin to the remaining portion, for example, by printing. The molded part 5 can also be formed by potting.

Also, the whole molded part 5 can be formed by printing. In this case, vacuum printing, which is a printing method performed in a vacuum, is preferable since vacuum printing allows the resin to efficiently flow into the gaps between the module substrate 3 and the IC package 1 etc.

In the semiconductor device 20 illustrated in the figure, the molded part 5 is formed so as to encapsulate the IC package 1 and the passive components 2A and 2B. However, this is not to be construed as limiting, and the molded part 5 can be formed so as to cover at least a part of the IC package 1. Also, the molded part 5 can be formed so as not to cover the whole passive components 2A and 2B, since the amount of heat generated thereby is not large and the need for protection is small.

The coating 6 is preferably formed of a composite of conductive particles and a resin in order to provide good heat conductivity (e.g., heat conductivity of 0.7 to 10 W/(m·K)) and ease of formation. More specifically, the coating 6 is desirably formed by mixing conductive particles with a particle size (media value) of 0.5 to 60 μm and a resin that is liquid at room temperature to form a paste and applying the paste around the molded part, for example, by vacuum printing. The ratio of the conductive particles to the whole paste is preferably 30 to 85% by weight, and more preferably 70 to 80% by weight.

Examples of the conductive particles include particles of metals such as nickel silver, stainless steel, copper, iron, silver, aluminum, platinum, gold, cobalt, nickel, and manganese, and carbon particles. Examples of the resin that is liquid at room temperature are thermosetting resins such as epoxy resin, unsaturated polyester resin, and phenolic resin.

The module substrate 3 has a multi-layer structure and contains interconnection electrodes 7 such as power electrode layers and ground electrode layers. The interconnection electrodes 7 are exposed at the side end faces of the module substrate 3. The coating 6 is formed so as to cover the side end faces of the module substrate 3 so that it is in contact with the exposed interconnection electrodes 7. This configuration allows the heat produced by the IC package 1 and the passive components 2A and 2B to be transferred to the coating 6 through the interconnection electrodes 7. The heat transferred to the coating 6 is dissipated to outside from the coating 6. It is thus possible to improve the heat dissipation of the semiconductor device 20.

The interconnection electrodes 7 are preferably ground interconnection electrodes, since the ground interconnections are connected to all the electronic components including the IC package 1 and the passive components 2A and 2B.

Also, in the mounted structure 10 illustrated in the figure, the solder balls 8 connecting the semiconductor device 20 and the main substrate 30 are exposed. However, this is not to be construed as limiting, and it is also possible to fill a resin into the gaps between the module substrate 3 of the semiconductor device 20 and the main substrate 30 to seal the connection part formed by the solder balls 8. In this case, the connection part between the semiconductor device 20 and the main substrate 30 can be reinforced.

Figure 2A:
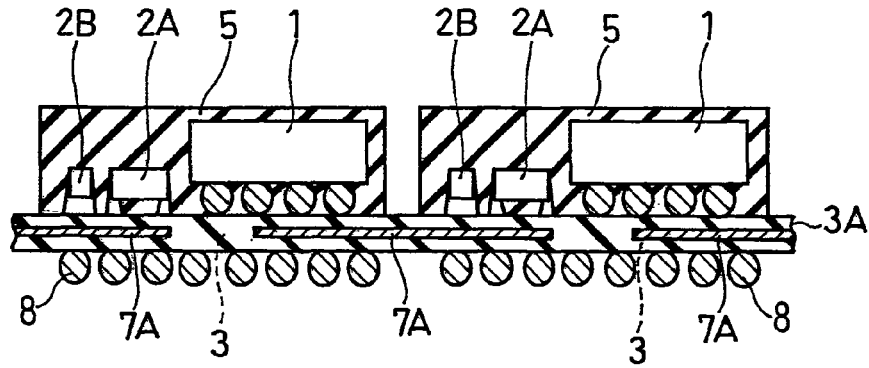
FIG. 2A is a partially cross-sectional view showing a first state of the production process of the semiconductor device.
Figure 2B:
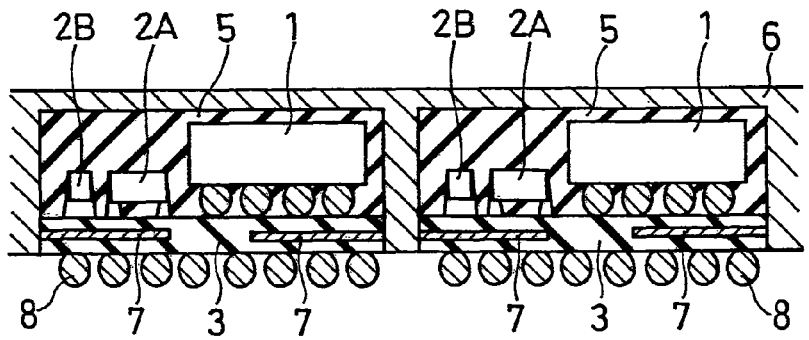
FIG. 2B is a partially cross-sectional view showing a second state of the production process of the semiconductor device.
Figure 2C:
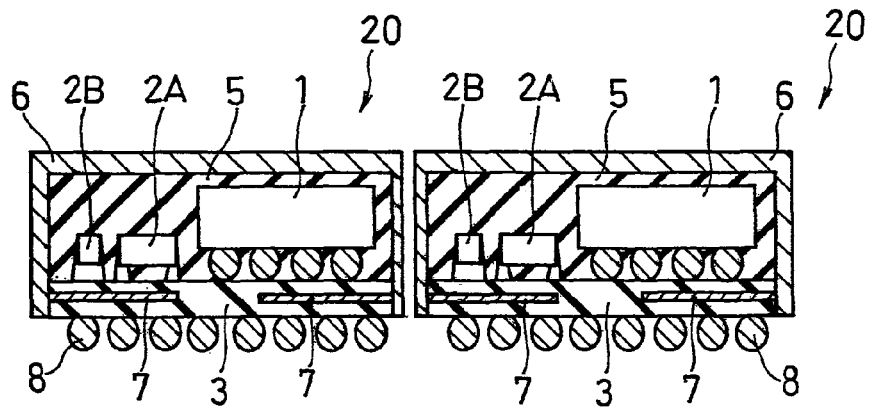
FIG. 2C is a partially cross-sectional view showing a final state of the production process of the semiconductor device.

Referring now to FIGS. 2A to 2C, the process for producing the semiconductor device 20 is described.

First, as illustrated in FIG. 2A, a plurality of the module substrates 3 are continuously formed on a substrate material 3A. It is noted that precursors 7A of the interconnection electrodes 7 are embedded in the substrate material 3A. Subsequently, the IC package 1 and the passive components 2A and 2B are mounted on each of the module substrates 3 formed on the substrate material 3A.

Thereafter, a resin serving as the material of the molded part 5 is applied, for example, by vacuum printing to encapsulate the IC package 1 and the passive components 2A and 2B into the molded part 5. In vacuum printing, when the vacuum in the printing device is released, the resin serving as the material of the molded part 5 flows into the gaps between the module substrate 3 and the IC package 1 etc. This results in a shortage of the resin to cover the IC package 1 etc. Thus, vacuum printing is again performed to squeeze the resin thereto in order to make up for the shortage. In this way, the use of vacuum printing to form the molded part 5 allows the connection part between the module substrate 3 and the IC package 1 etc. to be reinforced more firmly.

Subsequently, the substrate material 3A including the precursors 7A is diced to expose the interconnection electrodes 7 at the side end faces of each of the module substrates 3. Thereafter, as illustrated in FIG. 2B, a paste made of the above-described material having good heat conductivity is applied by vacuum printing to form the coating 6 on the surface of the molded part 5. At this time, the coating 6 is formed so as to cover the side end faces of the module substrate 3 where the interconnection electrodes 7 are exposed, so that the coating 6 is in contact with the interconnection electrodes 7.

In vacuum printing, when the vacuum in the printing device is released, the paste flows into the voids on the surface of the molded part 5. This results in a shortage of the paste to cover the molded part 5. To make up for the shortage, the paste is again squeezed thereto. In this way, the use of the paste made of material having good heat conductivity to form the coating 6 by vacuum printing can provide very good adhesion between the molded part 5 and the coating 6. Therefore, heat is transferred very efficiently from the molded part 5 to the coating 6, thereby making it possible to significantly improve heat dissipation.

Thereafter, as illustrated in FIG. 2C, each of the semiconductor devices 20 is cut off by dicing.

As described above, in the semiconductor device mounted structure according to Embodiment 1, the coating 6 is formed from the paste made of material having good heat conductivity such that the coating 6 closely adheres to the surface of the molded part 5. Therefore, the heat dissipation path through which the heat of the IC package 1 is dissipated from the molded part 5 through the coating 6 by thermal radiation is not divided by the air, and good heat dissipation can be achieved. In this case, the use of vacuum printing to form the coating 6 can provide increased adhesion between the molded part 5 and the coating 6, which is more preferable.

Also, the coating 6 is formed so as to come into contact with the interconnection electrodes 7 exposed at the side end faces of the module substrate 3. Thus, the heat of the IC package 1 etc. can be dissipated, for example, through the interconnection electrodes 7 (ground electrodes, for example) and the coating 6. Hence, better heat dissipation can be achieved. Also, the semiconductor device 20 can be easily made thinner, compared with conventional devices in which a semiconductor component such as an IC package is covered by a reinforcing frame.

Further, since the paste made of material having good heat conductivity is used to form the coating 6, such a simple method as printing can be used to form the coating 6. It is thus possible to reduce the production cost of the semiconductor device 20.

Also, since the paste made of material having good heat conductivity is used to form the coating 6, for example, by vacuum printing, it is also possible to form the coating 6 after mounting the semiconductor device 20 on the main substrate 30 (see Embodiment 3 below). This allows greater flexibility in producing the mounted structure, thereby making it easy to reduce the cost.

Further, other methods for forming a coating with good heat conductivity on the surface of the molded part 5 include plating and vacuum deposition. However, it is usually very difficult to perform these methods after mounting the semiconductor device on the main substrate 30. For example, it is necessary to prevent the plating liquid from adhering to the other portions than the semiconductor device on the main substrate 30.

On the other hand, when the paste made of material having good heat conductivity is applied to form the coating, the paste can be easily provided only to the surrounding area of the semiconductor device in a pinpoint manner. It is thus possible to easily realize a semiconductor device with good heat dissipation and a mounted structure in which such a semiconductor device is mounted. In addition, the formation of the coating by the application of the paste on the surface of the molded part 5 also increases the strength.

Embodiment 2

Next, Embodiment 2 of the invention is described. Since Embodiment 2 is an alteration of Embodiment 1, the differences from Embodiment 1 are mainly described below.

Figure 3:
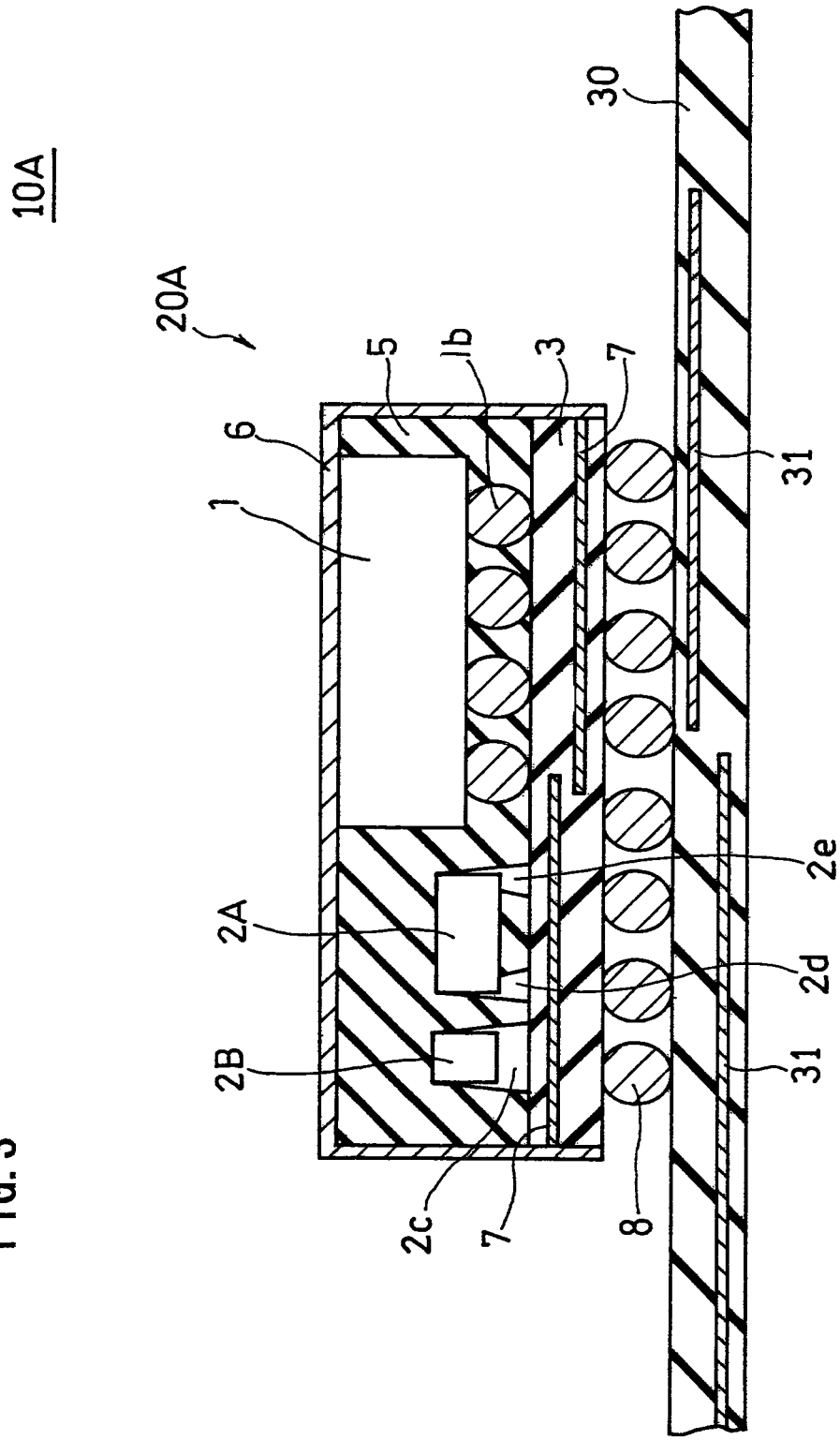
FIG. 3 is a partially cross-sectional view schematically showing the structure of a semiconductor device according to Embodiment 2 of the invention.

FIG. 3 is a partially cross-sectional view, similar to FIG. 1, schematically showing the structure of a semiconductor device according to Embodiment 2.

In a mounted structure 10A shown in the figure, a semiconductor device 20A is so structured that a part of the IC package 1 (the upper face of the IC package 1 in the figure) is not covered with the molded part 5 and is exposed at the surface of the molded part 5. The exposed part is in direct contact with the coating 6. In this way, the formation of the coating 6 in direct contact with a part of the IC package 1 allows the heat of the IC package 1 to be directly transferred to the coating 6. This further improves heat dissipation.

In the mounted structure 10A shown in the figure, the coating 6 is in contact with only a part of the IC package 1. However, it is also possible to form the coating 6 so that it contacts the passive components 2A and 2B as well as the IC package 1. This further improves heat dissipation.

Figure 4A:
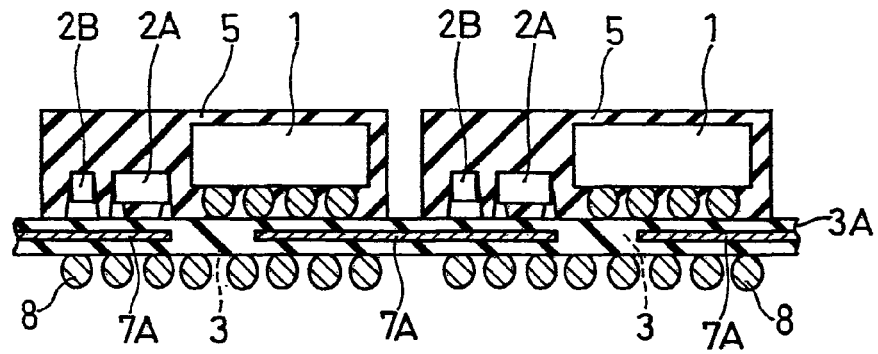
FIG. 4A is a partially cross-sectional view showing a first state of the production process of the semiconductor device.
Figure 4B:
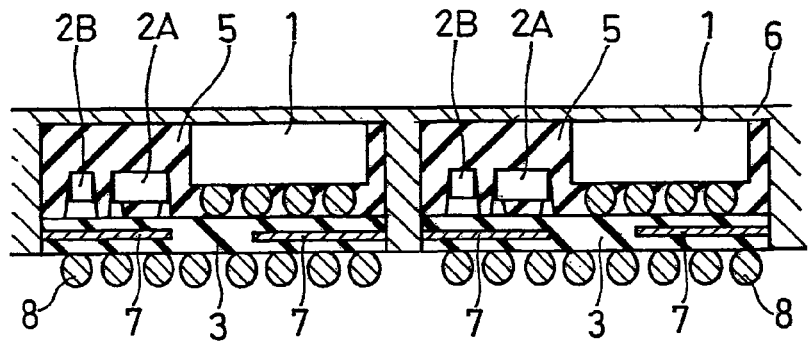
FIG. 4B is a partially cross-sectional view showing a second state of the production process of the semiconductor device.
Figure 4C:
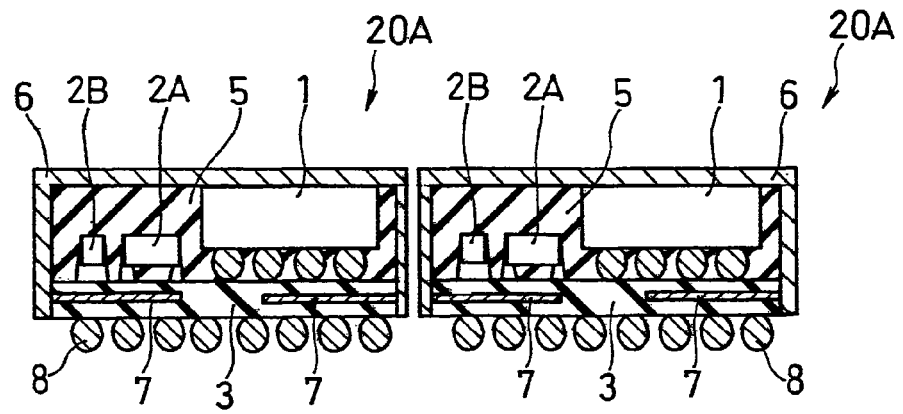
FIG. 4C is a partially cross-sectional view showing a final state of the production process of the semiconductor device.

Referring now to FIGS. 4A to 4C, the process for producing the semiconductor device according to Embodiment 2 is described.

First, as illustrated in FIG. 4A, a plurality of the module substrates 3 are continuously formed on the substrate material 3A. Subsequently, the IC package 1 and the passive components 2A and 2B are mounted on each of the module substrates 3 formed on the substrate material 3A. Thereafter, a resin serving as the material of the molded part 5 is applied, for example, by vacuum printing to encapsulate the IC package 1 and the passive components 2A and 2B into the molded part 5. In vacuum printing, when the vacuum in the printing device is released, the resin serving as the material of the molded part 5 flows into the gaps between the module substrate 3 and the IC package 1 etc. This results in a shortage of the resin to cover the IC package 1 etc. Thus, vacuum printing is again performed to squeeze the resin thereto in order to make up for the shortage.

Subsequently, the substrate material 3A including the precursors 7A is diced to expose the interconnection electrodes 7 at the side end faces of each of the module substrates 3. Thereafter, as illustrated in FIG. 4B, the molded part 5 is ground to expose a part of the IC package 1 (the upper face in the figure) at the surface of the molded part 5. Then, a paste made of the above-described material having good heat conductivity is applied by vacuum printing to form the coating 6 so as to cover the exposed part of the IC package 1 and the surface of the molded part 5. At this time, the coating 6 is formed so as to cover the side end faces of the module substrate 3 where the interconnection electrodes 7 are exposed, so that the coating 6 is in contact with the interconnection electrodes 7.

In vacuum printing, when the vacuum in the printing device is released, the paste flows into the voids on the surface of the molded part 5 and the voids on the surface of the IC package 1. This results in a shortage of the paste to cover the molded part 5. To make up for the shortage, the paste is again squeezed thereto. In this way, the use of the paste to form the coating 6 by vacuum printing can provide very good adhesion between the coating 6 and the molded part 5 and the exposed part of the IC package. Therefore, the heat of the semiconductor device 20 is transferred very efficiently to the coating 6, thereby making it possible to improve heat dissipation.

Thereafter, as illustrated in FIG. 4C, each of the semiconductor devices 20A is cut off by dicing.

As described above, in the semiconductor device according to Embodiment 2, at least a part of the IC package 1 is exposed at the surface of the molded part 5, and the coating 6 is formed so as to come into direct contact with the exposed part of the IC package 1. This allows the heat of the IC package 1 to be directly transferred to the coating 6, thereby realizing better heat dissipation.

In the semiconductor device 20A illustrated in the figure, only a part of the IC package 1 is exposed at the surface of the molded part 5 so as to come into contact with the coating 6, but this is not to be construed as limiting. It is also possible to expose a part of the passive components 2A and 2B in FIG. 3 at the surface of the molded part 5 and cover the exposed part with the coating 6 such that the passive components 2A and 2B directly contact the coating 6. This allows the heat of the passive components 2A and 2B to be directly transferred to the coating 6, thereby further improving the heat dissipation of the semiconductor device 20.

Embodiment 3

Next, Embodiment 3 of the invention is described. Since Embodiment 3 is an alteration of Embodiment 1, the differences from Embodiment 1 are mainly described below.

Figure 5:
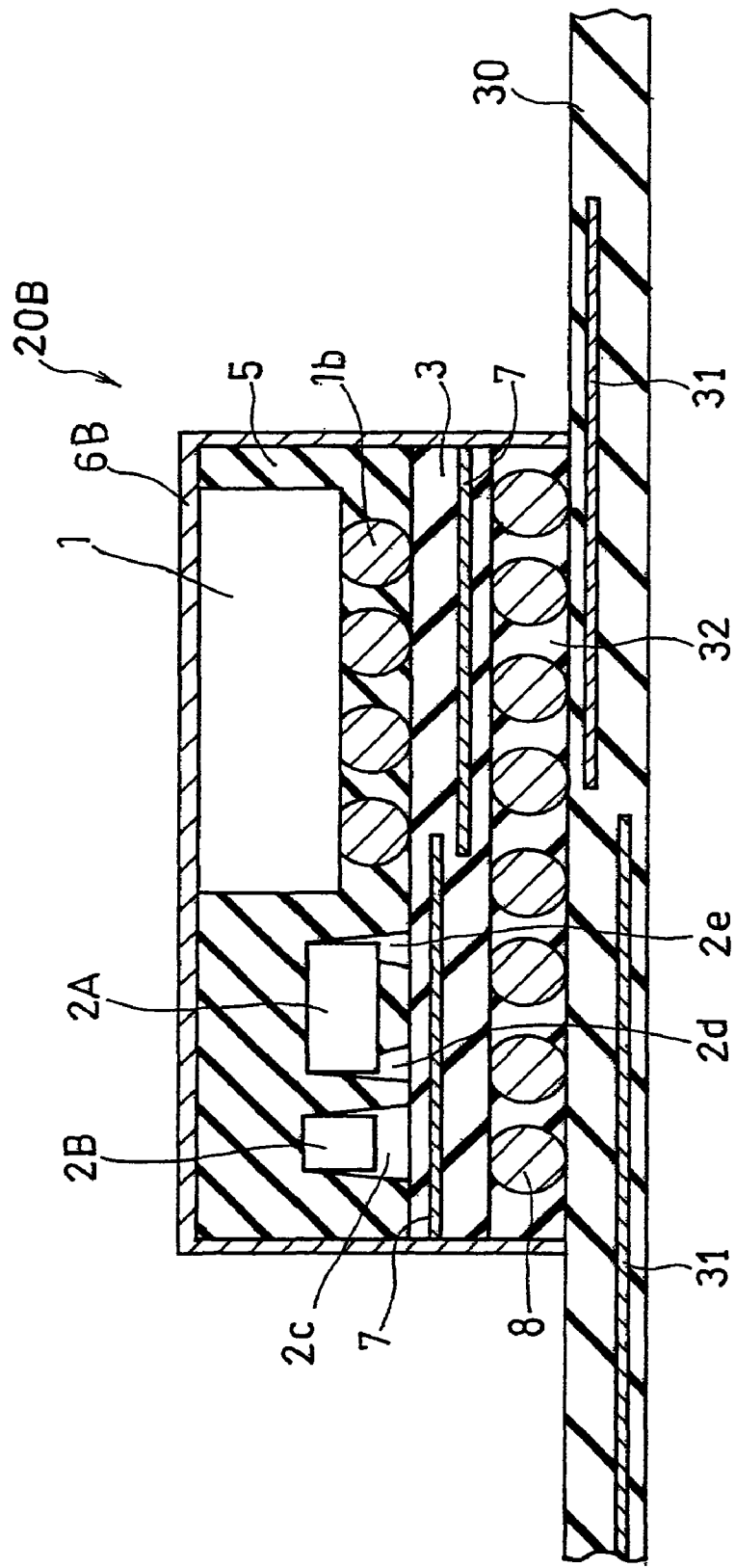
FIG. 5 is a partially cross-sectional view schematically showing the structure of a semiconductor device according to Embodiment 3 of the invention.

FIG. 5 is a partially cross-sectional view, similar to FIG. 1, schematically showing the structure of a mounted structure according to Embodiment 3.

In a mounted structure 10B illustrated in the figure, a semiconductor device 20B is so structured that a part of the IC package 1 is exposed at the surface of the molded part 5, in the same manner as in Embodiment 2. In addition, in the mounted structure 10B, a coating 6B extends to the surface of the main substrate 30 so that it is in contact with the interconnection electrodes (not shown) on the surface of the main substrate 30 (the surface on which the semiconductor device 20B is mounted). It should be noted that it is also possible to cover the whole IC package 1 without exposing a part of the IC package 1 at the surface of the molded part 5.

It is preferable that the gaps between the module substrate 3 and the main substrate 30 be filled with a resin 32 for the following reason. When the coating 6B is formed by vacuum printing, if the solder balls 8 are exposed, the lower part of the coating 6B (the part near the part in contact with the main substrate 30) may be drawn inward, thereby coming into contact with the solder ball 8 to cause a short-circuit.

In this way, filling the resin 32 into the gaps between the module substrate 3 and the main substrate 30 can provide a safer mounted structure.

Also, bringing the coating 6B into contact with the interconnection electrodes of the main substrate 30 allows the heat of the IC package 1 etc. to be dissipated through the main substrate 30. It is thus possible to further improve the heat dissipation of the semiconductor device. In the mounted structure 10B illustrated in the figure, the coating 6B is in contact with the interconnection electrodes on the main surface of the main substrate 30. However, this is not to be construed as limiting, and it is also possible to expose the inner interconnection electrodes 31 at the side faces of the main substrate 30 and bring the coating 6B into contact with the exposed interconnection electrodes 31.

Referring now to FIGS. 6A to 6D, the process for producing the semiconductor device according to Embodiment 3 is described.

Figure 6A:
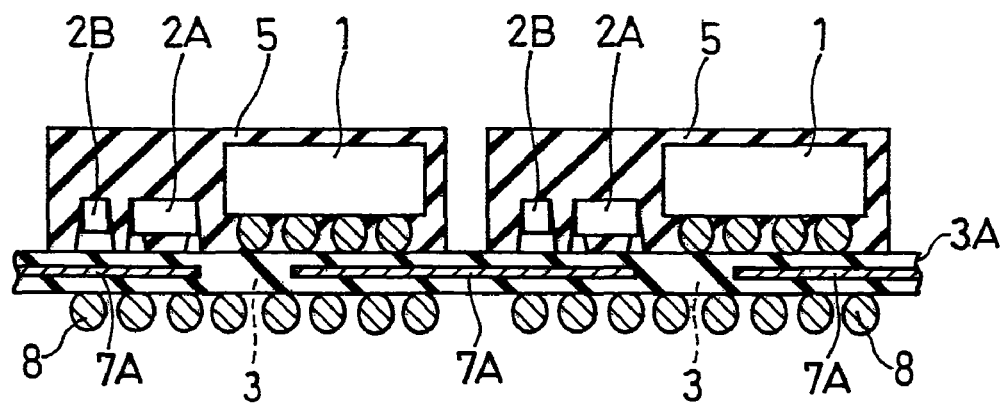
FIG. 6A is a partially cross-sectional view showing a first state of the production process of the semiconductor device.

First, as illustrated in FIG. 6A, a plurality of the module substrates 3 are continuously formed on the substrate material 3A. Subsequently, the IC package 1 and the passive components 2A and 2B are mounted on each of the module substrates 3 formed on the substrate material 3A. Thereafter, a resin serving as the material of the molded part 5 is applied, for example, by vacuum printing to encapsulate the IC package 1 and the passive components 2A and 2B into the molded part 5. In vacuum printing, when the vacuum in the printing device is released, the resin serving as the material of the molded part 5 flows into the gaps between the module substrate 3 and the IC package 1 etc. This results in a shortage of the resin to cover the IC package 1 etc. Thus, vacuum printing is again performed to squeeze the resin thereto in order to make up for the shortage.

Figure 6B:
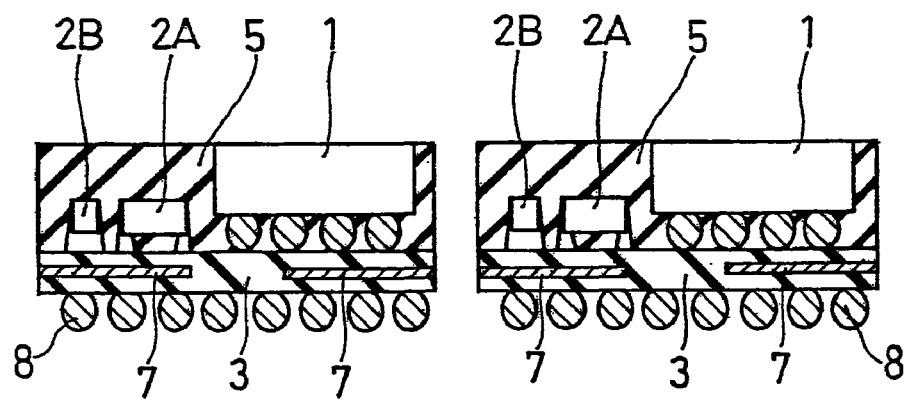
FIG. 6B is a partially cross-sectional view showing a second state of the production process of the semiconductor device.

Subsequently, as illustrated in FIG. 6B, the substrate material 3A including the precursors 7A is diced to expose the interconnection electrodes 7 at the side end faces of each of the module substrates 3, and the substrate material 3A is cut to obtain the respective module substrates 3. If necessary, the molded part 5 is ground to expose a part of the IC package 1 (the upper face in the figure).

Figure 6C:
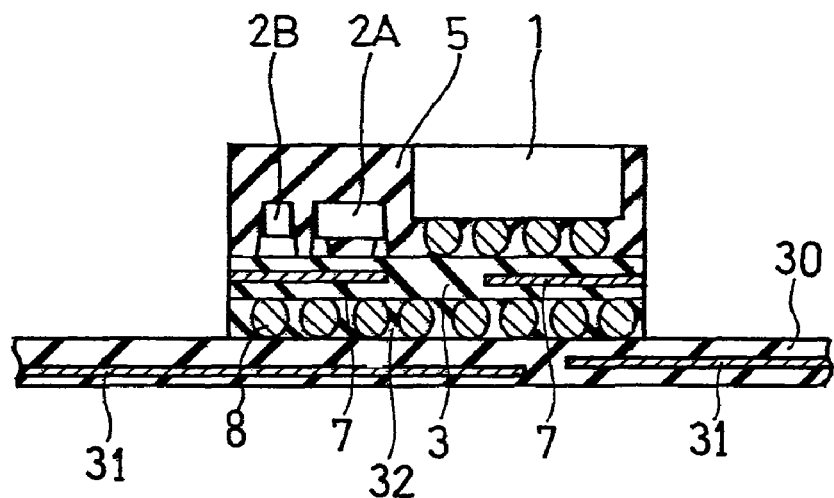
FIG. 6C is a partially cross-sectional view showing a third state of the production process of the semiconductor device.

Subsequently, as illustrated in FIG. 6C, the semiconductor device not covered with the coating 6B yet (i.e., the module substrate 3 on which the IC package 1 etc. are mounted) is mounted on the main substrate 30. If necessary, the resin 32 is filled into the gaps between the module substrate 3 and the main substrate 30.

Figure 6D:
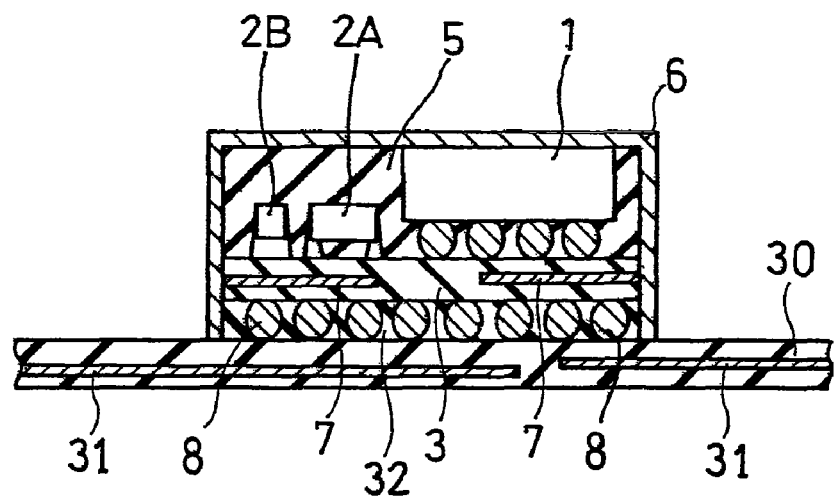
FIG. 6D is a partially cross-sectional view showing a final state of the production process of the semiconductor device.

Thereafter, as illustrated in FIG. 6D, the above-mentioned paste is applied by vacuum printing to form the coating 6B which extends to the surface of the main substrate 30. At this time, the coating 6B is brought into contact with the interconnection electrodes on the surface of the main substrate 30.

In vacuum printing, when the vacuum in the printing device is released, the paste flows into the voids on the surface of the molded part 5 and the voids on the surface of the IC package 1. This results in a shortage of the paste to cover the molded part 5. To make up for the shortage, the paste is again squeezed thereto.

As described above, according to the semiconductor device of Embodiment 3, since the coating 6B is in contact with the upper surface of the main substrate 30 and/or the interconnection electrodes exposed at the side faces, the heat of the IC package 1 etc. can be dissipated through the main substrate 30, and better heat dissipation can be achieved.

The semiconductor device of the invention has a sealing structure having excellent heat dissipation and allowing for thickness reduction, and can be advantageously used for mobile devices etc.

Although the invention has been described in terms of the presently preferred embodiments, it is to be understood that such disclosure is not to be interpreted as limiting. Various alterations and modifications will no doubt become apparent to those skilled in the art to which the invention pertains, after having read the above disclosure. Accordingly, it is intended that the appended claims be interpreted as covering all alterations and modifications as fall within the true spirit and scope of the invention.

The invention claimed is:

1. A mounted structure comprising:
  a semiconductor device including:
    a first circuit board with a first interconnection electrode that is exposed at a side end face of the first circuit board;
    a semiconductor component comprising an IC chip and being mounted on the first circuit board;
    a molded part comprising a resin and covering at least a part of the semiconductor component; and
    a coating covering a surface of the molded part, the coating comprising a composite of conductive particles and a resin, the coating being in contact with the first interconnection electrode exposed at the side end face of the first circuit board, and
  a second circuit board on which the semiconductor device is mounted, said second circuit board having a second interconnection electrode that is exposed at a surface of the second circuit board, the second interconnection electrode being in contact with the coating of the semiconductor device.

2. The mounted structure in accordance with claim 1, wherein the first interconnection electrode exposed at the side end face of the first circuit board is a ground interconnection electrode.

3. The mounted structure in accordance with claim 1, wherein the molded part seals a connection part between the semiconductor component and the first circuit board.

4. The mounted structure in accordance with claim 1, wherein at least a part of the semiconductor component is exposed at a surface of the molded part, and the exposed part of the semiconductor component is in contact with the coating.

5. The mounted structure in accordance with claim 1, wherein the conductive particles comprises at least one of nickel silver, stainless steel, copper, iron, silver, aluminum, platinum, gold, cobalt, nickel, and manganese.

6. The mounted structure in accordance with claim 1, wherein the resin of the composite comprises a thermosetting resin.

7. The mounted structure in accordance with claim 1, wherein the second interconnection electrode exposed at the surface of the second circuit board is provided on the surface thereof on which the semiconductor device is mounted.

8. The mounted structure in accordance with claim 1, wherein the second interconnection electrode exposed at the surface is provided on a side end face of the second circuit board.

9. The mounted structure in accordance with claim 1, wherein a connection part between the semiconductor device and the second circuit board is sealed with a resin.

* * * * *